United States Patent [19]

Jalichandra et al.

[11] 4,346,987
[45] Aug. 31, 1982

[54] PRINTED CIRCUIT BOARD PROJECTION IMAGING SYSTEM

[75] Inventors: Phijit Jalichandra, San Marino; John S. Dowell, Rosemead; John A. Carlson, Monrovia, all of Calif.

[73] Assignee: Xerox Corporation, Stamford, Conn.

[21] Appl. No.: 170,198

[22] Filed: Jul. 18, 1980

[51] Int. Cl.³ .............................................. G03B 27/52
[52] U.S. Cl. ..................................... 355/40; 352/222; 355/71; 355/77; 355/41
[58] Field of Search ...................... 355/40, 41, 77, 71; 352/222

[56] References Cited

U.S. PATENT DOCUMENTS

| | | |
|---|---|---|
| 3,103,850 | 9/1963 | Khoury et al. ..................... 352/222 |
| 3,354,806 | 11/1967 | De Lang et al. ..................... 355/41 |
| 3,494,695 | 2/1970 | Sollima et al. ..................... 355/41 |
| 3,716,298 | 2/1973 | Reardon ..................... 355/71 |
| 4,026,653 | 5/1977 | Appelbaum et al. ..................... 355/77 |

FOREIGN PATENT DOCUMENTS

1225045 9/1966 Fed. Rep. of Germany ...... 352/222

*Primary Examiner*—Monroe H. Hayes
*Attorney, Agent, or Firm*—Franklyn C. Weiss

[57] ABSTRACT

A system for projecting an image, via projection optics, from multiple circuits formed on a glass master onto a photoresist coated PCB panel. The projection optics precisely magnifies the reduced pattern formed on the master to full scale while maintaining the image-plane light uniformity. To insure proper magnification, the conjugate distances between the master and the projection optics and between the projection optics and the PCB panel are precisely controlled. Further, the relevant planes containing the master, optics and PCB panel are controlled to insure substantial perpendicularity with respect to the optical axis. A registration subsystem is also provided to register the PCB panelholding platen.

5 Claims, 12 Drawing Figures

PRINTED CIRCUIT BOARD PROJECTION IMAGING SYSTEM

BACKGROUND OF THE INVENTION

The printed circuit board (also known as printed wiring board) is presently predominantly manufactured employing the contact printing principle.

For a circuit board of moderately complex circuitry and high packing density, the printed circuit board (PCB) is designed with the aid of a computer. Operating in an interactive mode a design engineer or a layout specialist develops a layout on a computer driven plotter wherein the position and routing of each interconnecting conductor is drawn for the purpose of visual checking and/or design finalization. When the check plot has been reviewed and approved, the circuit pattern is digitized and the coordinates of endpoints of conductors, conductor widths, coordinates of holes, etc., are encoded and stored in computer memory. A photographic film master is then generated using a computer-controlled precision photo plotter. Additional tooling is also produced for this pattern by the computer in the form of magnetic or paper tapes used to drive numerical controlled drilling machines, board testers and component insertion machines. The function thus described is commonly referred to as computer-aided design.

Manufacturing economy dictates that the PCB's be fabricated in panels with each panel containing multiple circuit boards. For example, a panel 18 inches by 24 inches may consist of six identical circuit boards and in the parlance of the art the panel is designed as six-up. To generate the six-up working film the digital information generated during the computer-aided design phase is employed to drill a bare board for a six-up pattern for use as a tooling panel. Six identical film patterns are then pasted up on the drilled tooling panel and visually registered to insure a perfect alignment between the drilled holes and their corresponding images. A new film master with the multiple PCB pattern is made from the paste-up and rechecked with the drilled tooling panel. The new film master represents a third generation image (second generation if the step-and-repeat operation is done by the photo plotter, an alternative approach if the plotter format is as large as the required panel size).

A large number of working films are then produced from contact prints of the new film master since each working film can only be used approximately 20 times before it is bleached and scratched beyond acceptable performance. This represents a fourth generation of image transcription.

The final transfer of circuit image onto the photoresist is done by manual paste-up and visual registration of the working film onto the predrilled and photoresist-coated panel and finally by exposure of photoresist with an ultraviolet light source. The panel is then developed, inspected and reworked, plated, etched and committed to further processing.

It should be clear from the heretofore description that the contact printing process requires, from the original digital information, many generations of image transfer. In each and all the transfer steps, meticulous care must be exercised to control the film dimensional stability through the strict control of ambient temperature and humidity. It requires a large staff for continually making films.

There are also other problems inherent in the preparation and transcription of circuit image by contact printing. One is the image degradation caused by film wear and worse still the problem of dust and particulate matter pickup during the handling and/or imaging processes. These minute, extraneous materials ultimately show up as electrical shorts or opens on the finished printed circuit boards. A large staff of quality assurance inspectors and touch-up operators is required for constantly examining and repairing the circuit images prior to plating and etching. Despite this, defective PCB's attributed to poor imaging are still produced.

What would be desired is to provide an improved PCB manufacturing process wherein substantial cost savings through manufacturing yield improvement by better imaging techniques could be realized; through significant reduction of staff for imaging work, inspection and touch-up operations; and through the accumulative savings of materials as a result of improved yields.

SUMMARY OF THE PRESENT INVENTION

The present invention provides a system for projecting an image, via projection optics, from multiple circuits formed on a glass master onto a photoresist coated PCB panel. The projection optics precisely magnifies the reduced pattern formed on the master to full scale while maintaining the image-plane light uniformity. To insure proper magnification, the conjugate distances between the master and the projection optics and between the projection optics and the PCB panel are precisely controlled. Further, the relevant planes containing the master, optics and PCB panel are controlled to insure substantial perpendicularity with respect to the optical axis. A registration subsystem is also provided to register the PCB panelholding platen.

It is an object of the present invention to provide a novel system for accurately projecting an image, in magnified form, from a master onto a substrate sensitive to the projected image light.

It is a further object of the present invention to provide a system for projecting an image via projection optics from multiple electrical circuit patterns formed on a glass master onto a photoresist coated printed circuit board panel.

It is still a further object of the present invention to provide a printed circuit board imaging system wherein an image formed on a master is projected, in magnified form, onto a remote photoresist coated printed circuit board and wherein means are provided to accurately control the conjugate distances between the master and the projection optics and the projection optics and the panel and further wherein the relevant planes containing the master, the projection optics and the panel are controlled to insure substantial perpendicularity with respect to the optical axis and wherein means are provided to accurately register the platen supporting the printed circuit board.

BRIEF DESCRIPTION OF THE DRAWINGS

For a better understanding of the invention as well as other objects and further features thereof, reference is made to the following description which is to be read in conjunction with the following figures wherein.

DESCRIPTION OF THE PREFERRED EMBODIMENT

Figure 1:
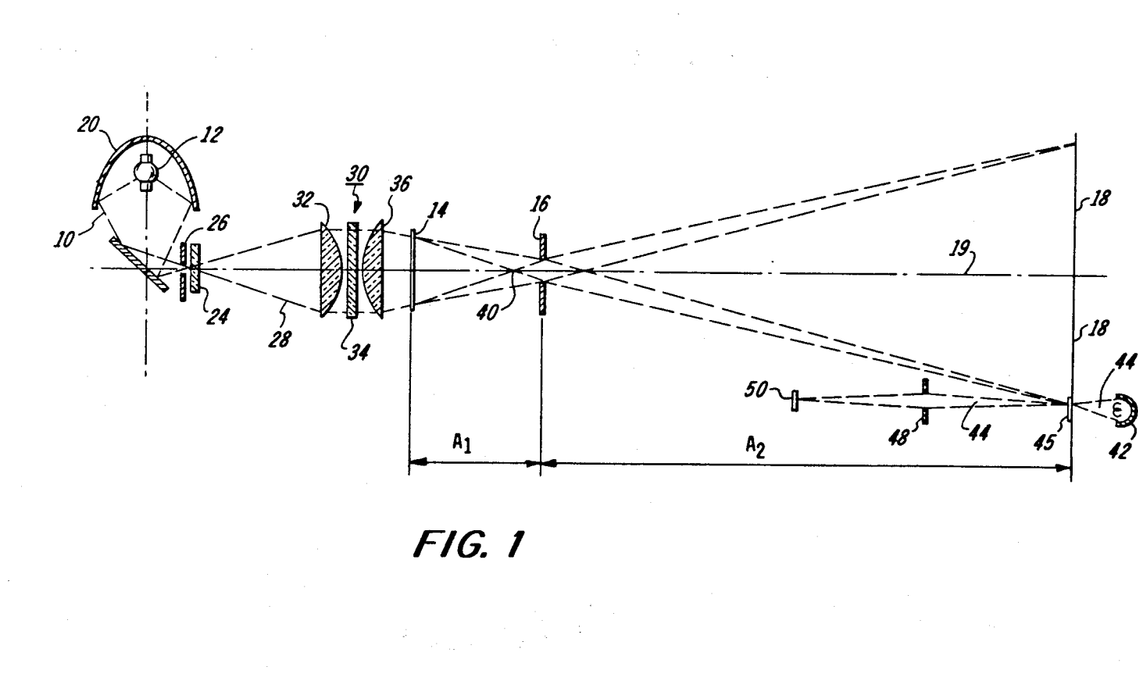
FIG. 1 is a schematic of the optical portion of the present invention.

FIG. 1 illustrates in schematic form the optical principle of the system of the present invention.

In particular, a light beam 10 which has a substantially uniform intensity and spectral characteristic suitable for photoresist exposure, such as the radiation generated by a mercury-xenon lamp 12, is directed through a glass master 14 to a projection optics 16. The glass master 14 is preferably made from a multiple pattern film master at a reduced scale, for example at one-fourth magnification. The glass master 14 is also made with an optical polarity suitable for the photoresist being used, be it positive or negative type.

The projection optics 16 consists of several lens elements, described in detail in copending application Ser. No. 133,220 filed Mar. 24, 1980, and assigned to the assignee of the present invention and serves to project the light which has passed through the master (object) 14 to a photoresist-coated printed circuit board (PCB) panel 18. Although the size format for panel 18 is variable, an 18×24 inch format is a typical example. The function of projection optics 16 is to magnify with precision the reduced pattern of the master 14 to full scale while maintaining the image-plane light uniformity. The teachings of the above-mentioned copending application necessary for an understanding of the present invention is incorporated herein by reference. The degree of imaging precision desired for this application is that the optical distortion is 0.013 percent or less; e.g. +0.002-inch error over the entire 18×24 inch format. As set forth in the copending application, the specific prescription for the lens elements provides the desired imaging precision.

To insure the proper magnification, the conjugate distances between the master 14 and projection optics 16, and between the projection optics 16 and the PCB panel 18 ($a_1$ and $a_2$, respectively) are precisely controlled. In addition, the relevant planes containing the master 14, optics 16 and PCB panel 18 are controlled to insure substantial perpendicularity with respect to the optical axis 19 (the system which achieves the control of the conjugate distances and plane perpendicularity will be described hereinafter).

The lamp 12 is enclosed within an ellipsodial reflector 20 which reflects the light 10 generated by lamp 12 onto mirror 22, the reflected light being directed to an optical integrator 24 after passing through controllable shutter 26. Integrator 24 receives and redistributes light 10 in such a manner that emerging light 28 has uniform intensity. The integrated light beam 28 is directed onto a condenser/filter assembly 30 which comprises, in the embodiment shown, two lenses 32 and 36 and filter 34. The condenser/filter assembly 30 functions to collimate the integrated light beam to spot 40 for efficient utilization of light. The use of filter 34 is optional, depending on the spectral requirement of the photoresist.

A light source 42 is provided adjacent the back side of PCB panel 18 and generates a light beam 44 which passes through a hole 46 in platen 46 (FIG. 2) and an aligned drilled hole 45 in panel 18. When panel 18 is correctly positioned with respect to the optical axis 19 and alignment pins in platen 64 (alignment pins engage notches formed on panel 18), the beam 44 passing through the hole 45 is collected by detector optics 48 which focus the light incident thereon onto photodetector 50, the photodetector 50 generating a signal utilized in the control portion of the system as described hereinafter to accurately align panel 18 with the projected image.

Figure 2:
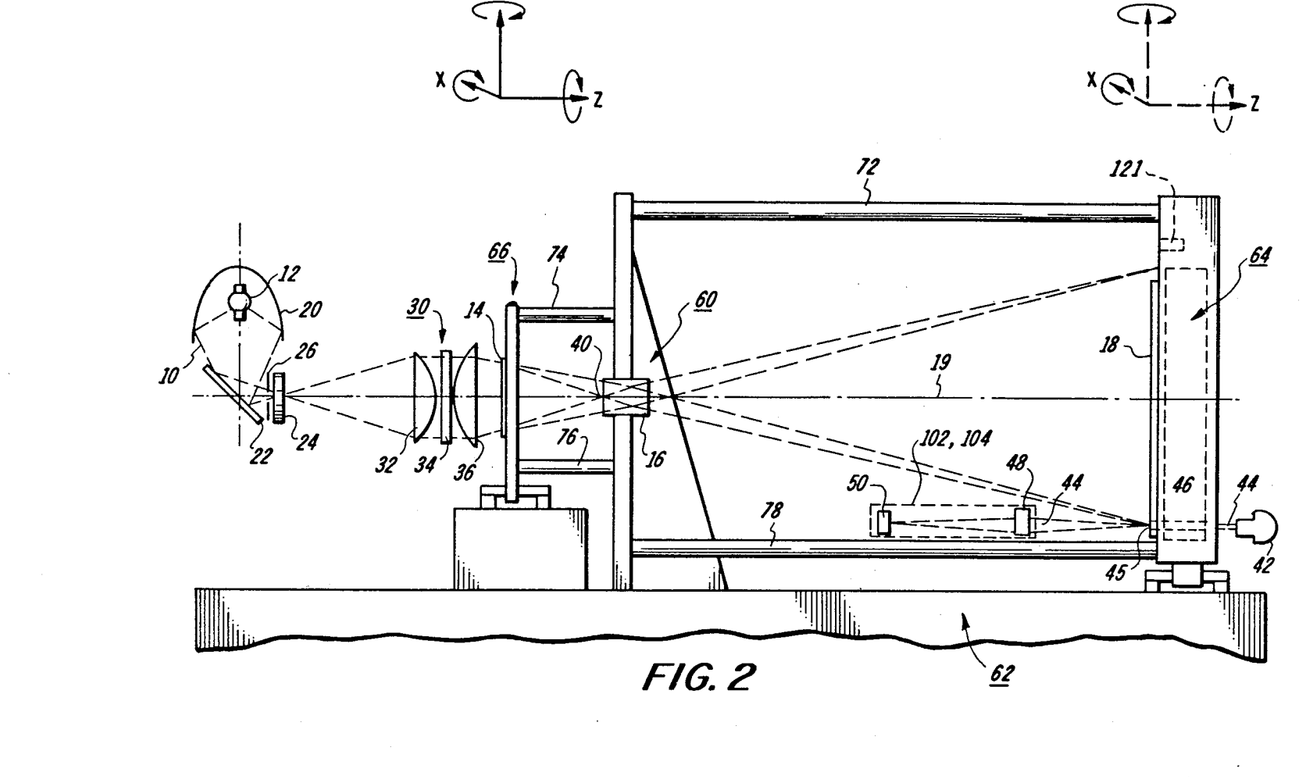
FIG. 2 is a simplified side view of the present invention illustrating the master, projection optics and PCB supporting structure.

Referring now to FIG. 2, a simplified drawing showing the optical system of FIG. 1 incorporated into the projection system of the present invention, structure 60 (shown in more detail with reference to FIGS. 5 and 7B hereinafter) is provided to hold the projection lens assembly 16 stationary on a vibration isolation table 62. A platen structure 64, mounted within a housing 65, is also provided to hold PCB panel 18 stationary and perpendicular to isolation table 62 while a support structure 66 is provided to hold the master 14 perpendicular to the isolation table 62. Structures 65 and 66, which hold the PCB panel 18 and master 14, respectively, are allowed to move along the optical axis 19 if there is any temperature variation from ambient to allow for the corresponding magnification adjustment. The perpendicularity of the three planes (master, projection optics and PCB panel) with respect to the optical axis 19 is maintained by six spacer rods 72,74 . . . 82 (spacer rods 80 and 82 not being shown in the figure); rods 74,76 and 80 and 72, 78 and 82 each being spaced (in a manner described hereinafter) and connecting two adjacent planes, the spacer rods having adjustment screws associated therewith to allow for perpendicularity adjustments when required. The same material is selected for all the spacer rods, the overall structure thereby being self-compensating in terms of maintenance of magnification ratio if any temperature variation exists. FIG. 2 also illustrates the types of movement which the support structures 65 and 66 can provide for the adjustment and alignment of the glass master 14 and the PCB panel 18 (via the platen 64); i.e., movement in the direction of the X-axis (horizontal); in the direction of the Y-axis (vertical); and movement of the Z-axis (in the direction of the optical axis 19).

Figure 3:
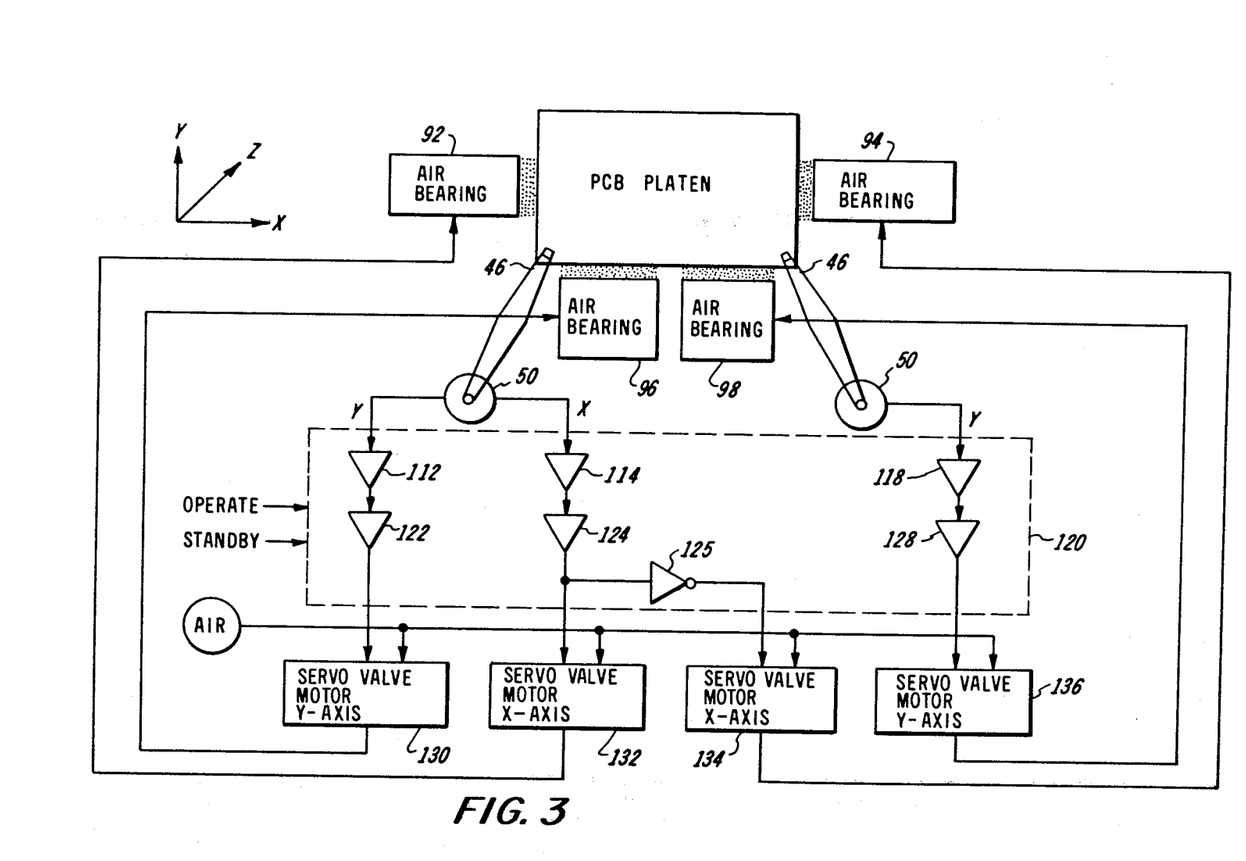
FIG. 3 is a schematic of the registration subsystem of the present invention.

The registration subsystem, shown in schematic form in FIG. 3, provides an important feature of the present invention. It consists of the PCB panel holding platen 64, air bearings 92, 94, 96 and 98 to drive and position the platen 64, as will be described hereinafter in more detail, and a position detection system and a feedback servomechanism 100 which translates the error signals derived from two platen position detector assemblies 102 and 104 into driving forces operating on the aforementioned air bearings. Vacuum (or air suction) is used as a means for the platen 64 to hold the PCB panel 18 thereon. The vacuum platen, supported by the air bearings, is allowed to move freely in the plane perpendicular to the optical axis 19 (in the X and Y directions). Although for reason of magnification ratio control, panel 18 is not normally allowed to move in the direction of the optical axis 19 (Z-direction), magnification adjustment may be provided to compensate for an undersized or oversized master by allowing for adjustment of the spacer rod lengths as will be described. In particular, the two X-axis bearings, 92 and 94, act in a "push-pull" arrangement via servo valve motors 132 and 134 and inverter 125. In other words, as one bearing acts to drive platen 64 in one direction along the X-axis with an increase in air pressure, the air pressure in the bearing which is utilized to drive the platen 64 in the opposite direction along the X-axis is simultaneously decreased an equal amount. Servo valve motors (or motorized air pressure regulators) 130 and 136 drive their respective air bearings 96 and 98. The Y-axis bearings, in contradistinction to the X-axis bearings, act independently of each other and therefore a slight rotational movement of platen 64 about the Z axis is provided when necessary.

Each air bearing is mounted to structure 65 via mounting plates, the air pressure released by the air bearings having the capability of imparting ±0.005 inches of motion to the platen 64. Each bearing has an air plenum with a small aperture to let air pressure escape, the servo motors in turn controlling valves which regulate the amount of air provided to the air bearings. The greater the air pressure in a bearing, the larger the air cushion between the plate and platen 64 and the greater the movement of the platen 64.

The registration system is initialized, in a manner to be described hereinafter, such that platen 64 is set to the middle of its range of movement. In other words, if the total air bearing movement is 0.010 inch in the Y-axis direction, platen 64 is initially positioned in the middle so that it is capable of movement of 0.005 inches in opposite Y axial directions.

It should be noted that the use of air bearings in the present system provides an essentially vibration free system and, when compared to the alternate lead screw positioning technique, provides greater resolution and is less expensive and less cumbersome.

The operating principle of the registration subsystem can be explained in conjunction with FIGS. 2 and 3. First, the PCB panel 18 is provided with two optical tooling holes (only one hole 45 illustrated) which have been accurately placed with respect to the two pre-drilled holes 46 in platen 64. Prior to commencement of imaging of a large number of panels, a tooling alignment panel is used to align the subsequent panels with respect to the magnified circuit pattern, to establish the optimum position of the air bearings, and to establish the null position of the two detectors 102 and 104. Position detection is achieved by passing light from source 42 (actually two sources are utilized) emanating from the back side of the vacuum platen 64 through holes 45 and 46 provided for this purpose. Light beams passing through the two optical tooling holes on the panel create the X- and Y-axis error signals from detectors 102 and 104 which are conditioned by preamplifiers 112, 114 and 118 and the electronic controller 120. Three power amplifiers 122, 124 and 128 residing within the electronic controller 120 operate the corresponding servo valve motors 130, 132, 134 and 136, respectively, which in turn operate on the air bearings 92, 94, 96 and 98 until registration is achieved. As set forth hereinabove, the output from preamplifier 114 provides a single "push-pull" X-position control by utilizing an inverter 125.

As described in more detail hereinafter (with reference to FIG. 9 hereinabove), upon completion of registration, an enabling signal is sent from the electronic controller 120 to open the light shutter 26. The required exposure level, which has been determined prior to the production run, is controlled automatically by the integrating exposure control unit (actually a light intensity detector and integrating energy meter) 121 mounted at the photoresist plane and supported within structure 65. Although the system preferably will be housed in a controlled environment, transmission degradation of the overall optical train may occur slowly as a function of operational time. The source of degradation might be due to lamp aging and due to minute films accumulated on the optical surfaces of the master and lens elements. These degradations are automatically compensated for by the light intensity detector 121 which receives optical radiation from a light cone enanating from the corresponding tooling hole image in the master 14. The output of detector 121 is coupled to an integrating exposure control meter (located in controller 120) which allows the shutter 26 to remain open until the preset energy dosage has been reached.

The registration subsystem described hereinabove pertains to a back-lighted system. However, a front-lighted detection system can be utilized. For example, light cones emanating from the master 14 going through two specially prepared tooling holes in the PCB panel 18 and reflecting back to detectors can be utilized. Preferably, the bare copper surfaces surrounding the tooling holes would be painted black to enhance the detector signal to noise ratio. The front-lighted registration can be configured if a laser having an ultra stable beam is available (beam position wander of ordinary lasers is of the same order of magnitude with the PCB panel positional errors to be detected).

Figure 4:
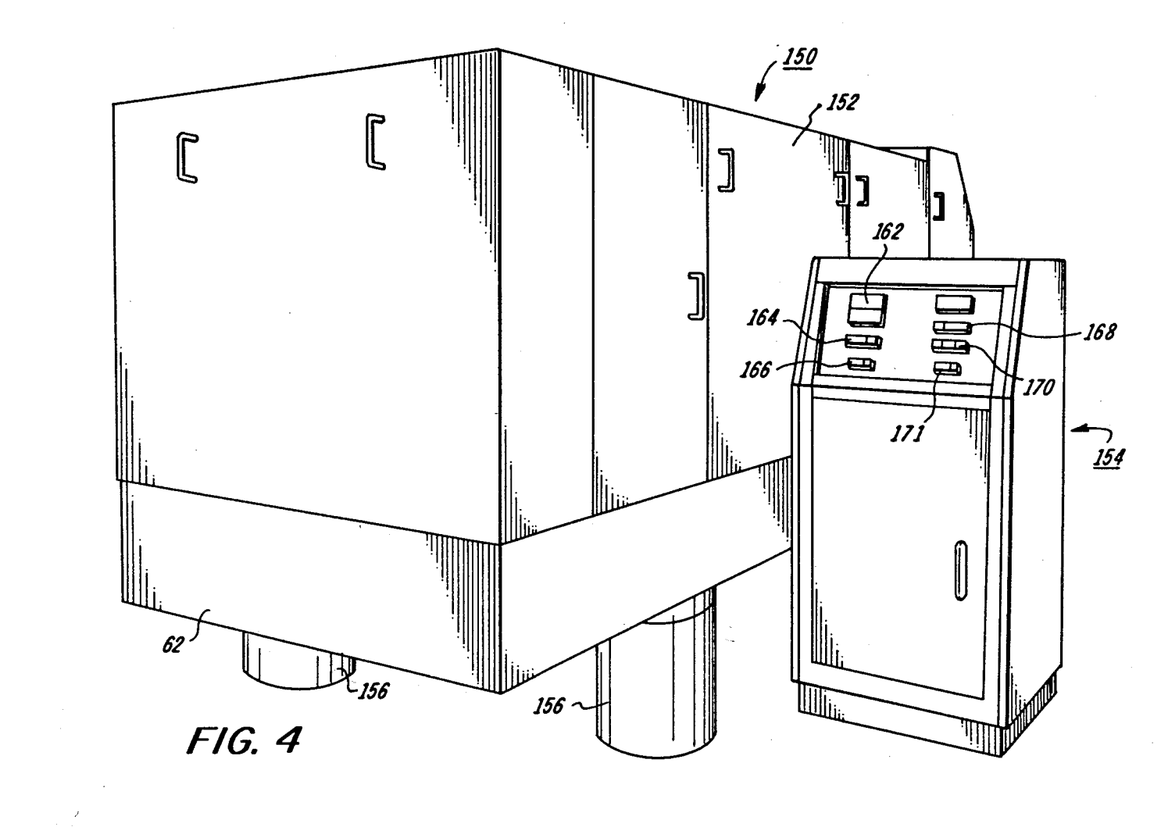
FIG. 4 is a perspective view of a machine configuration which incorporates the teachings of the present invention.

FIG. 4 is a perspective view of a machine configuration which may incorporate the teachings of the printed circuit board projection imaging system as described hereinabove. In essence, the system 150 includes an imaging module 152 and the control module 154. Four support members 156 are provided to support vibration isolation table 62 thereby isolating the imaging module 152 from any disturbance which may occur during imaging.

The indicators 162, 164, 168 and 170 and pushbuttons 166 and 172 interface the following system operations with the operator:

Indicator 162—lamp voltage and current monitors.
Indicator 164—indicates lamp AC on; system power on; lamp start ready; lamp coolant failure.
Pushbutton 166—power off; power on; lamp start.
Indicator 168—indicates service or operate modes.
Indicator 170—indicates ready to expose; shutter open; no registration.
Pushbutton 172—registration reset.

Figure 5:
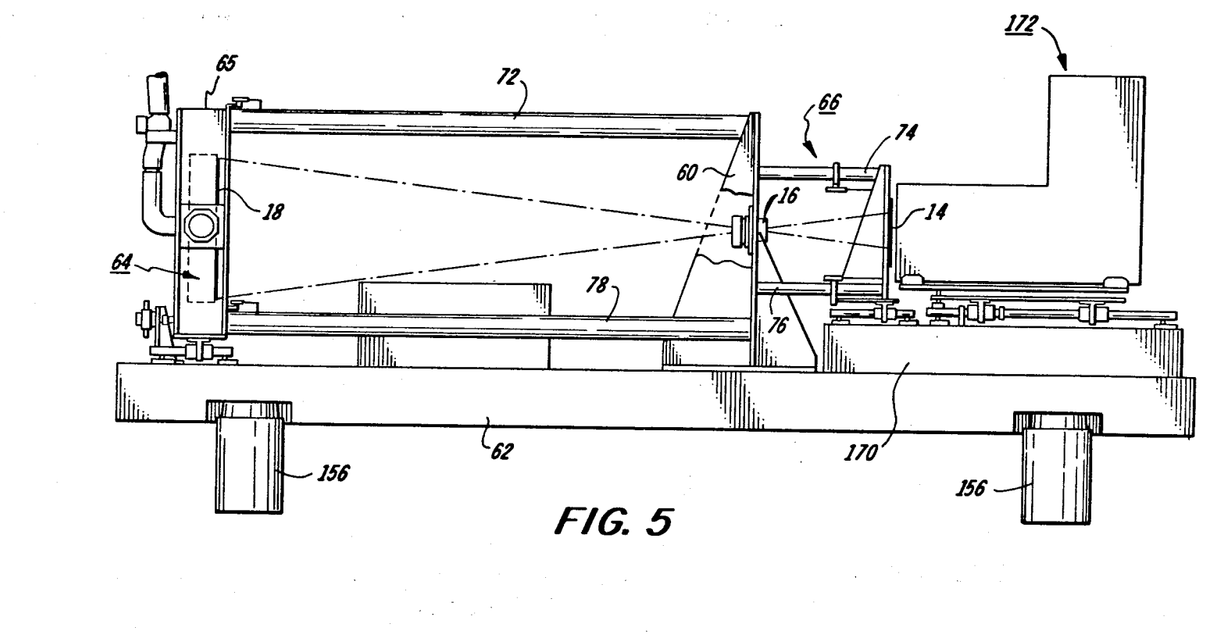
FIG. 5 is a side view of the machine configuration shown in FIG. 4 with covers removed.

FIG. 5 is a simplified side view of the system shown in FIG. 4 with some of the covers removed. Isolation table 62 is shown supported by air cushioned support members 156 to isolate the table 62 and the structures supported thereon from vibrations which would otherwise affect the operation of the system.

Figure 6A:
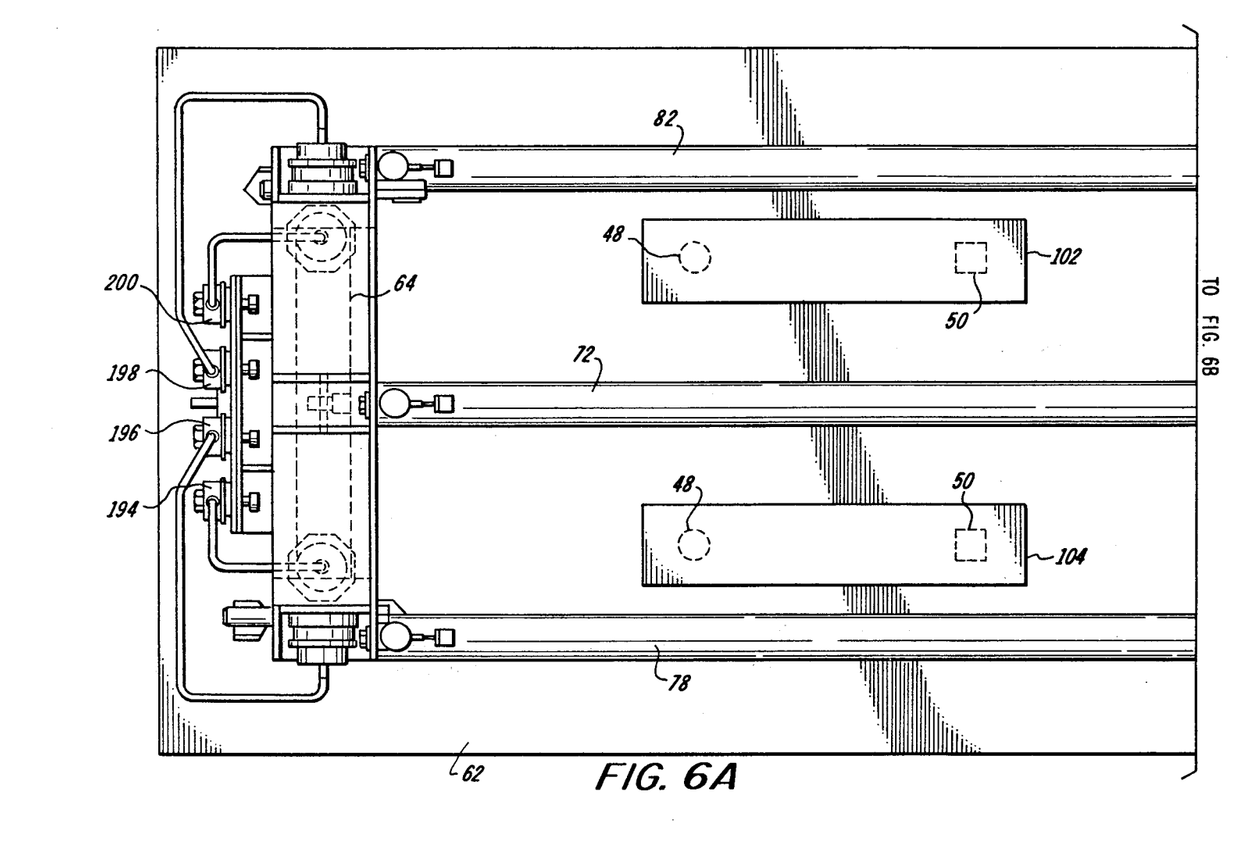
FIGS. 6A and 6B, when taken together, is an enlarged top view of the machine shown in FIG. 4 with covers removed.

Spacer rods 72 and 78 form the long conjugate tripod assembly along with the third spacer rod 82 (shown in FIG. 6A.) Platen assembly 64 supports panel 18 thereon within housing 65. Platform assembly 170 acts to support the master support structure 66 and illuminator module 172. Central support structure 60 supports the projection optics 16 while rods 74 and 76 form the short conjugate tripod assembly along with a third spacer rod 86 (shown in FIG. 6B.) In a typical case, the panel 18 at the image plane is 18×24 inches whereas the object size on glass master 14 at the object plane is 6×4½ inches (magnification of system is arranged to be 4.00).

In a typical embodiment, a two sided PCB panel consists of seven layers of material. The innermost layer, or base layer, is a glass epoxy. On either side of the base layer is a copper layer 0.002 inches thick, a photoresist layer 0.0015 inches thick, and a transparent mylar protective sheet. The base layer and copper layers may vary in thickness with the total thickness of the PCB panels varying from 0.007 to 0.125 inches. The panels can vary in size from 16×20 inches to 18×24 inches although other sizes can be accommodated.

A hierarchy of alignment references on panel 18 are utilized during the imaging process: two slots for mechanical coarse alignment, and two drilled holes 45 for high precision alignment involving servo control. The reference slots and holes are located along the bottom or long edge of the PCB panels in a position common to all panel sizes. The relationship of the slot to tooling hole is repeatable to within 0.003 inches for each panel within any given production lot. The edges of the PCB panels are not accurately machined and, therefore, is not used for alignment purposes.

The system has the following set-up adjustments:
(a) long and short optical conjugate adjustment (provide magnification, focus and panel thickness variation adjustments);
(b) glass master position adjustments (provides translation and rotation necessary to align projected aerial image to pre-processed PCB panel); and
(c) position adjustment of illuminator 172.

Figure 6B:
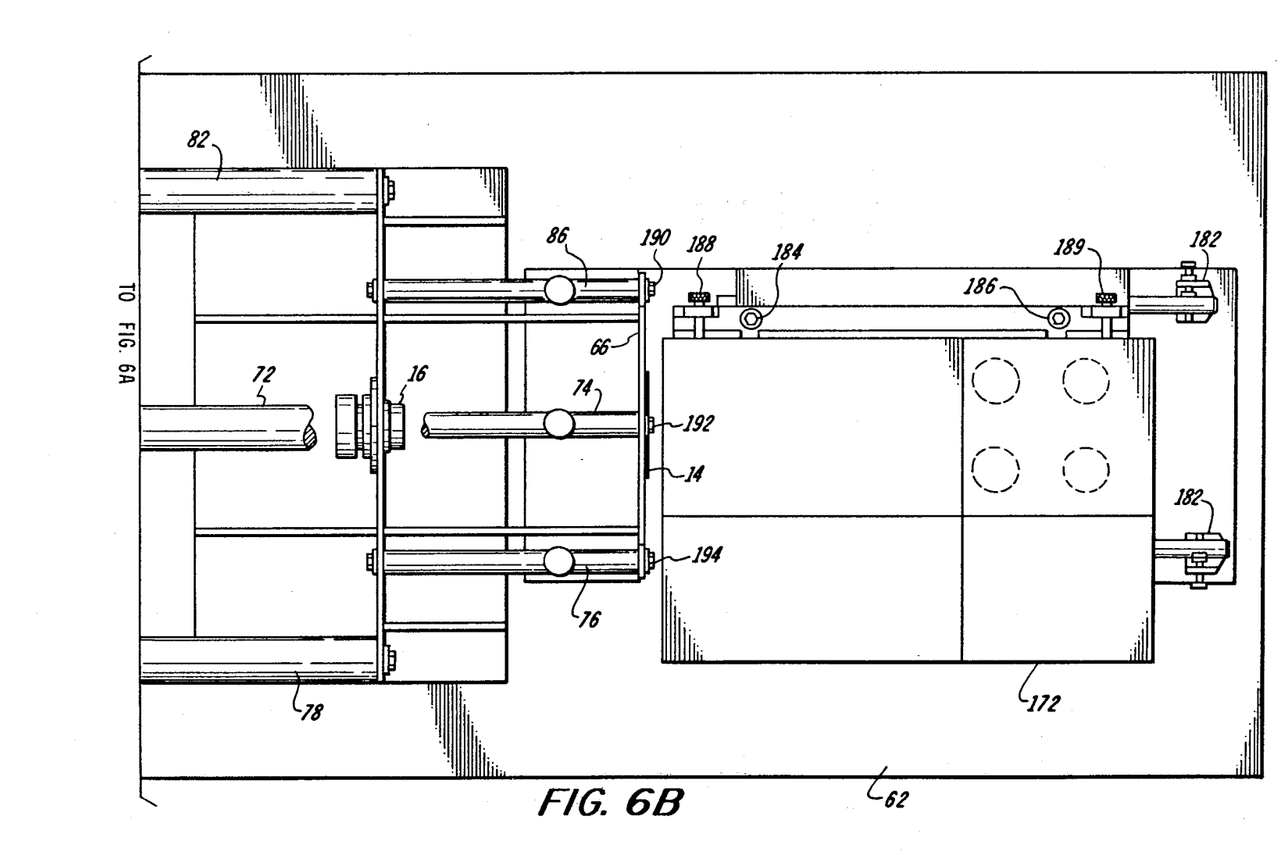

FIGS. 6A and 6B, taken together, show the top view of the system and, in particular, the two photodetectors 102 and 104 positioned to receive the light transmitted through the two holes 46 in platen 64 and the corresponding drilled holes 45 in panel 18. As illustrated, photodetector assemblies 102 and 104 each comprise optics 48 and photodetector 50. Also shown in more detail are the mechanisms utilized to adjust the positions of illuminator 172 and the structures which support the projection optics 16 and the master 14. In particular, FIG. 6B shows the mounts 182 for the Thompson bushing, the vertical adjustment mechanisms 184 and 186 for illuminator 172 and screw mechanism 188 for movement of the illuminator in the X-axis direction.

Figure 7A:
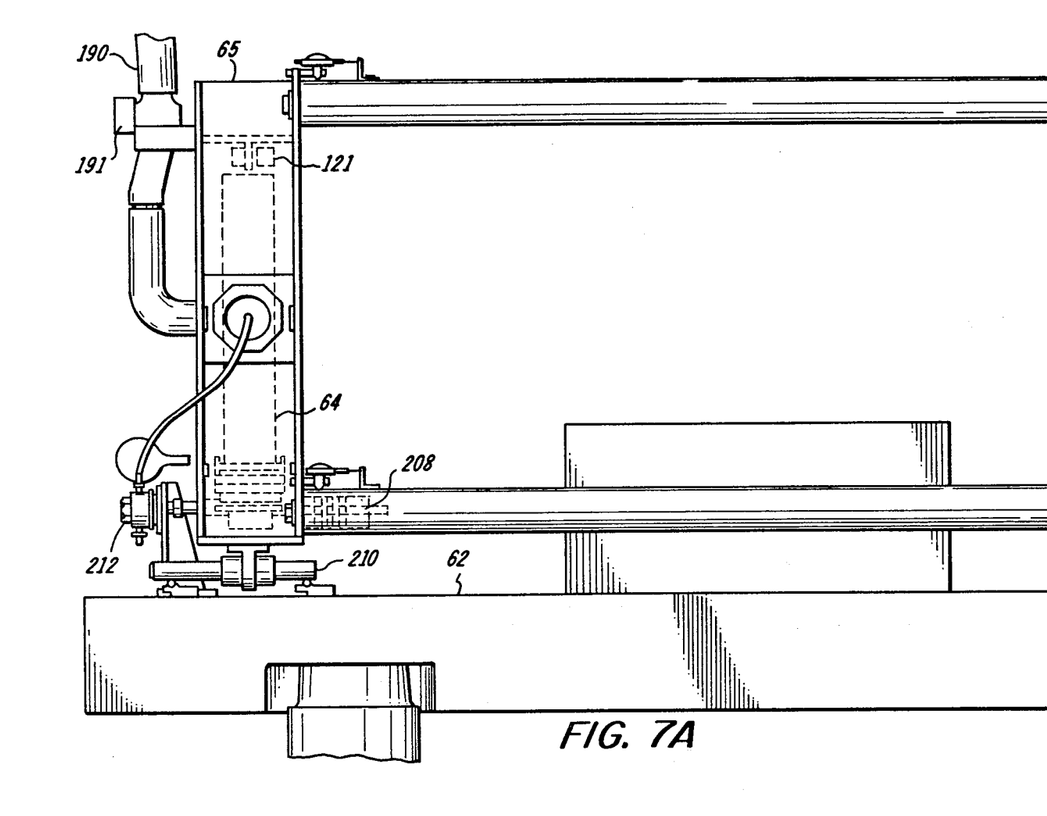
FIGS. 7A and 7B, when taken together, is an enlarged side view of the machine shown in FIG. 4 with covers removed.
Figure 7B:
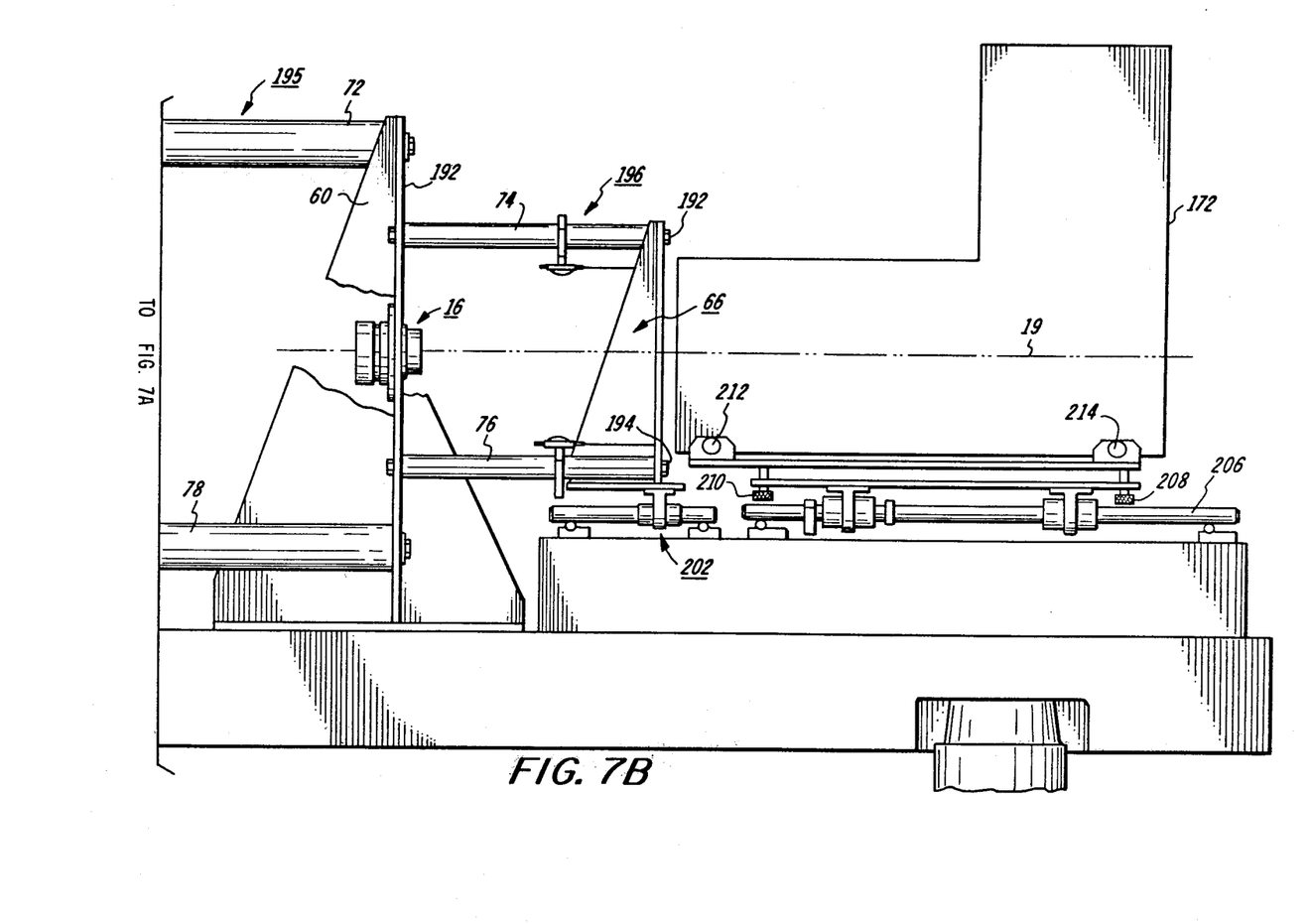

FIGS. 7A and 7B is an elevation view of the structure illustrated in FIGS. 6A and 6B, respectively. Vacuum hose 190 is coupled to platen 64 via vacuum switch 191. The integrating exposure sensor 121 is shown positioned adjacent the platen 64 to receive a cone of light transmitted from the master 14.

The projection optics 16 is mounted within an apertured plate structure 192 which in turn is supported by triangularly shaped support structure 60.

As shown in FIG. 7B, bulkhead 60 is the main support structure for projection lens assembly 16. Two tripod assemblies, 194 and 196, provide the reference point for setting up the entire optical system. Tripod assembly 196 (typically less than 16 inches long) comprises spacer rods 74, 76 and 80 while tripod assembly 195 (typically 72 inches long) comprises spacer rods 72, 78 and 82. Support structure, or bulkhead 66, holds glass master 14, structure 66 in turn being secured to tripod assembly 196 via three bolts (loaded against Belleville washers) 190, 192, and 194 (third bolt not shown). Assembly 65 is also supported by Thompson bearings 202 and 204. These bearings allow the system focus to be adjusted and provide for stabilization in the horizontal and vertical directions and are adjustable to allow for adjustment of the overall optical plane (movement along Z-axis) and to also allow for a tilt type of motion.

Referring to illuminator 172, rod 206 (second rod on far side not shown) allows the illuminator 172 to move in the direction of the optical axis 19 to install new glass masters as required. Screws 184, 186, 208 and 210 allow for movement in the Y-axis direction so that illuminator 172 can be optically aligned with the rest of the system. Screws 188, 189, 212 and 214 allow illuminator 172 to move in the X-axis direction to provide for optical alignment with the rest of the system.

Referring once again to FIG. 7A, platen 64 is supported within platen support structure 65. This structure has the capability of movement in the direction of optical axis 19 to adjust for the thickness of panel 18 and also to adjust system focus. Movement of the entire platen structure 66 is accomplished by utilizing finely threaded bolts loaded against Bevill washer 208 providing a spring load and assembly with a one-inch range of movement. The platen support structure is mounted on Thompson bearing assembly 210 which allows for movement along optical axis 19.

Air regulator assembly 212 contains the servo motor and regulator (valve) and is a side view of the Y-axis bearing acting on platen assembly 66.

Figure 8:
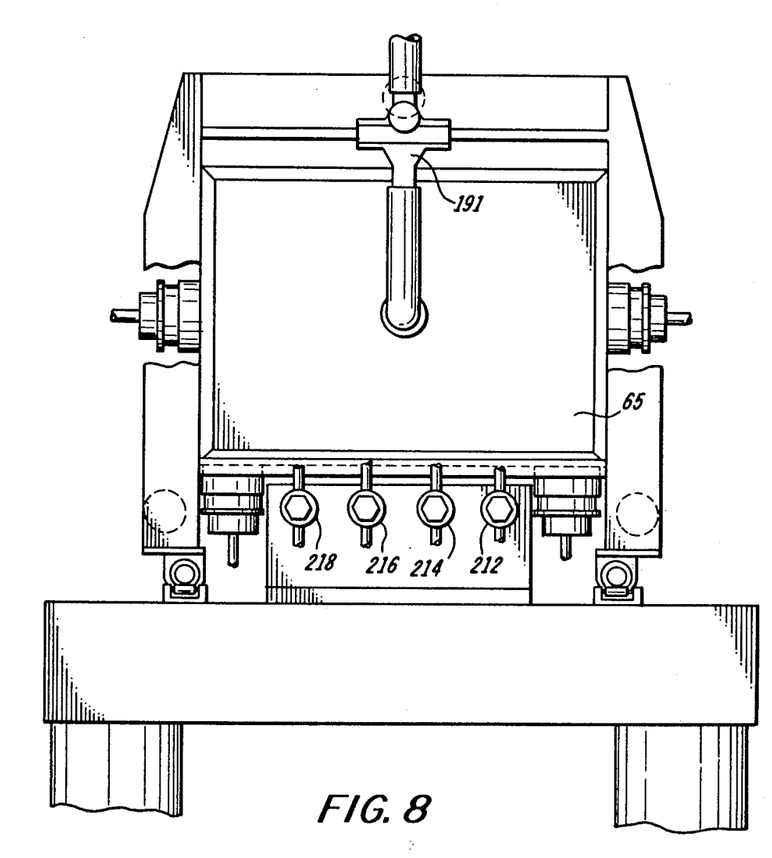
FIG. 8 is an end view of the machine shown in FIG. 4.

FIG. 8 is an end view of the overall structure and shows platen support structure 66 and four air regulator assemblies 212, 214, 216 and 218. Vacuum switch 191, activated by a foot switch, controls the vacuum to the platen 64.

Figure 9A:
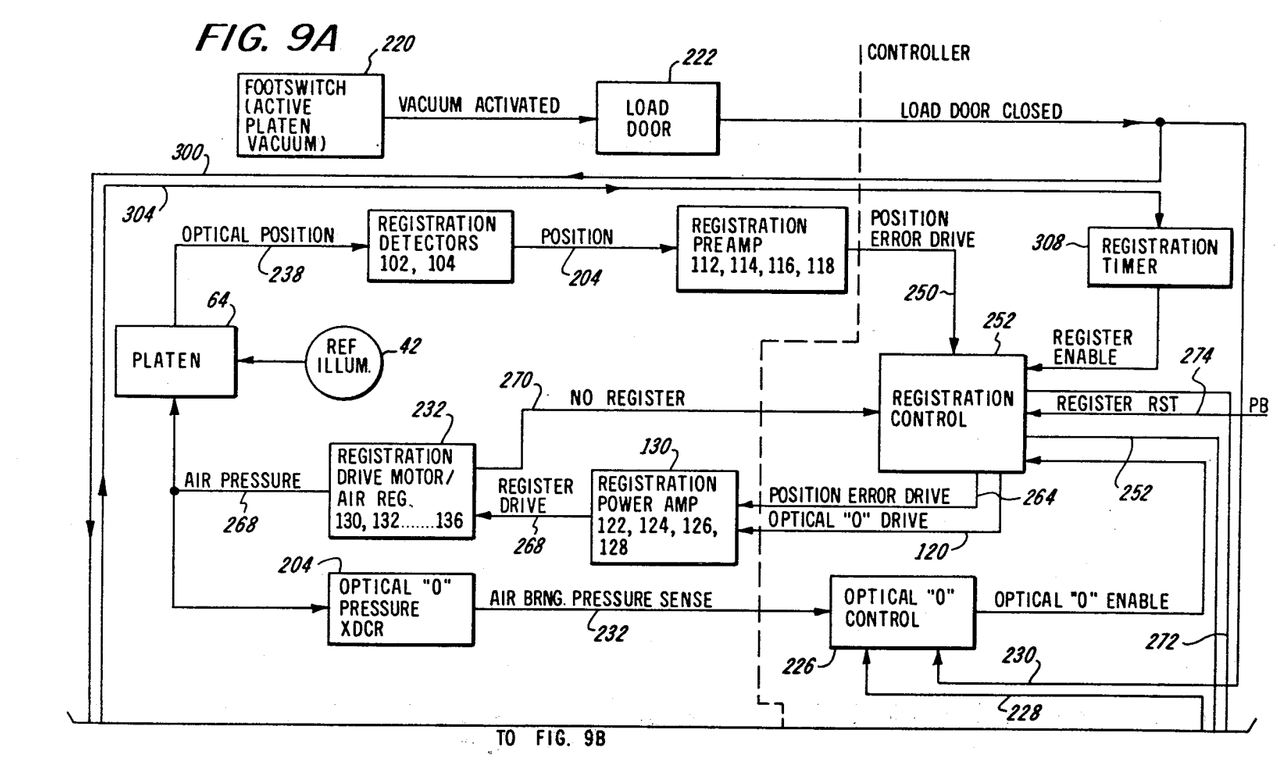
FIGS. 9A and 9B are the block diagram of the system of the present invention.
Figure 9B:
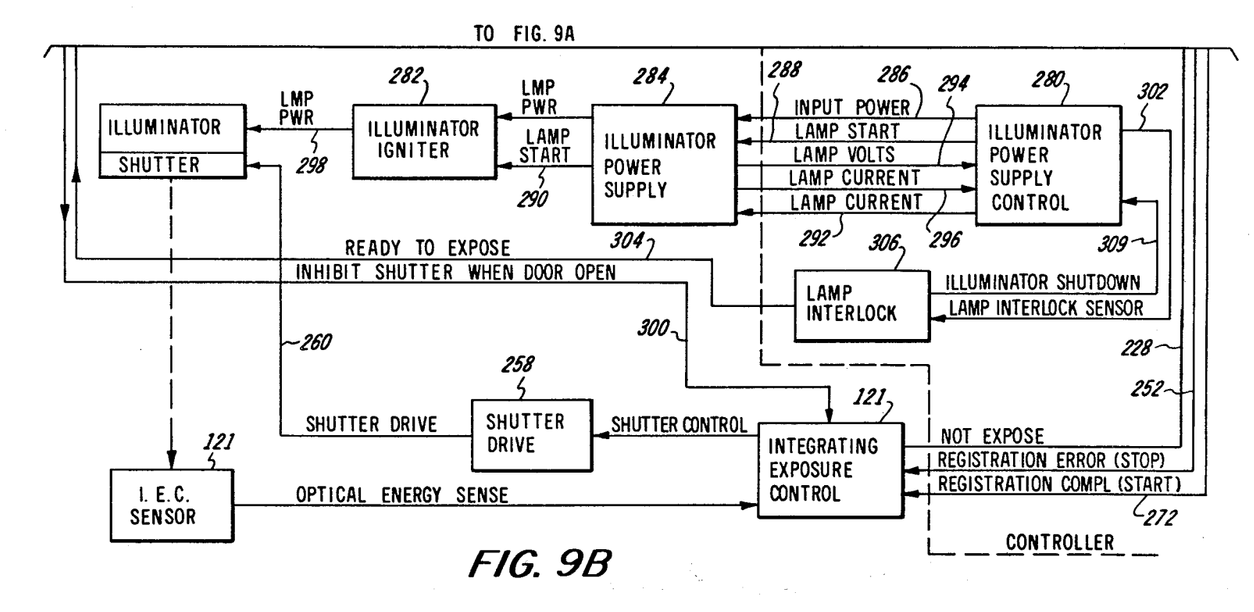

Referring to FIG. 9, a block diagram of the PCB projection imaging system of the present invention is illustrated. The operation of the system, in the context of the block diagram, is as follows:

The system is initialized prior to actually exposing a photoresist coated panel by coating a flurescent material on a non-resist coated panel. This panel is installed on the platen alignment pins (two), a foot switch 220 associated with the control module is activated to apply the vacuum for the platen. The system is placed into the "SERVICE" mode whereby the system interlocks are disabled. During this mode (and the automatic mode described hereinafter), the illuminator lamp is placed in a condition ready to illuminate the glass master 14. The platen 64 is manually positioned to the center of its range. The printed circuit patterns projected from the glass master are aligned with the corresponding plurality of drilled holes (not the alignment holes) in panel 18 by adjusting glass master 14. This provides an initial, or reference, position for the automatic registration system to be described hereinafter. Thereafter, the system is placed in the automatic, or, OPERATE, mode, the operator installs the photoresist coated panel, the foot switch is again activated and the load door 222 is closed, the system thereafter positioning the panel, if necessary, to bring the panel 18 into accurate registration.

In the period of time between the removal of a panel (initializing panel or otherwise) and the placement of a subsequent panel on the platen, a control circuit is activated to reposition the platen to the point where it has been initialized.

This circuit, or the optical "0" control, drives the platen 64 back to the center of the initial range each time such that in the event that the panel exposed had been misregistered and the platen 64 had been positioned by the registration system to one range extreme, the next panel placed on the platen would not be offset in the opposite direction. The optical "0" circuit, therefore, reduces the positioning time required to register the next panel by returning the platen back to the center of its range (based on the pressure of the air bearings). The integrating exposure control 121 senses when the panel exposure is complete and generates a signal to optical "0" control 226 via lead 228. Control 226 has two other inputs; an input on lead 230 indicating that the load door 222 is open or closed and an input on lead 232 indicating the air bearing plenum pressure.

Light source 42 backlights platen 64 and provides an optical position signal to registration detectors 102, 104 via lead 238, detectors 102 and 104 being positioned downstream from and optically aligned with the alignment holes in panel 18 and platen 64. The detectors generate an X, Y position error signal on lead 240 which is coupled to the inputs of registration preamplifiers 112 . . . 118. The position error drive signal from the preamplifiers on lead 250 is coupled to the registration control means 252 as another input thereto.

During the sending of the position error, a position error drive signal is generated by registration control 252 and applied to registration power amplifiers 122 . . . 128 via lead 264. A registration drive signal on lead 264, generated by the power amplifiers, is applied to registration drive (motor/air regulators) 130 . . . 136 which applies air pressure to sides of platen 64 via lead 268. As long as an error signal is sensed by registration detectors 102, 104 and transmitted to the registration control 252, the motor/regulators 130 . . . 136 will cause the platen 64 to move until the registration detectors 102, 104 sense a null, which will cause registration control 252 to send a registration complete (start expose) signal to integrating exposure control 121 via lead 272, causing shutter 26 to open. The registration control simultaneously disables the registration error signal on lead 264 for the duration of the exposure.

In the event the PCB panel 18 is improperly installed on platen 64 or one of the predrilled optical alignment holes 45 in panel 18 is either improperly located or obscured, this will cause one or all of the motor/regulators 130 . . . 136 to drive to a preset limit, activating a limit switch within the motor/regulator 130 . . . 136, sending a no register signal to registration control 252 via lead 270. The no register signal causes the registration process to cease, a no register indicator 170 (FIG. 4) and a standard inhibit circuit (not shown) to activate whereby the start expose signal to the integrating exposure control 121. At this point the PCB panel 18 is removed from the platen 64 to correct the anomaly, by the operator. The Optical "0" is then automatically energized to reset the platen to the center of its travel as previously described. The operator resets the registration control 252 by depressing registration reset switch 172. The system is then ready to process another panel 18.

The illuminator assembly 172 contains a 2.5 KW HgXe lamp 12 to provide illumination for the projection system, as earlier described. The projection lamp 12 is powered by a commercially available power supply 284 with its associated series type igniter 282. Controls 280 to apply and remove power and to ignite the lamp are located in control module 154 along with appropriate displays 161, 162 to monitor necessary operating parameters of the projection lamp 12.

The control system contains interlocks that provide for the safety of the operator as well as providing functional automatic operating controls as follows:

(1) If either load door 222 is open or opened, an inhibit (shutter close) signal is transmitted to integrating exposure control 121 via lead 304 to either prevent the shutter 26 from opening or to cause the shutter 26 to close, if already opened.

(2) Illuminator power supply control 280 provides lamp power and starting voltage via leads 286, 288 and 292. Lamp interlock circuit 306 provides a ready to expose signal via lead 304 to enable registration timer 308 to operate. Otherwise the system will not register or image a panel when in the Operate mode. A second function of lamp interlock circuit 306 is to sense conditions that indicate the projection lamp 12 has failed, and provide an illuminator shutdown signal via lead 309 to the illuminator power supply control 280. This condition requires the attention of a service technician to correct.

(3) Failure of the lamp 12 and reflector 20 cooling systems will cause the illuminator power supply control 280 to remove power from the lamp 12.

When the system is operated in the Operate mode, all interlocks are enabled. When used in the Service mode, the interlocks can be overridden by the operator to provide for initial alignment procedures and experiments or other tests.

Referring back to FIG. 2, illuminator 42 backlights panel 18, the light being transmitted through hole 45 in the panel. Lens 48 refocuses the light onto detector 50 for alignment purposes. Actually, two detectors are provided. In FIG. 6A, modules 102 and 104 each house the detector system and its associated optics. Module 102 senses one Y axis and module 104 senses another Y axis and the X axis. The air bearing controlled by detector 102 causes the right side of platen 64 to be pushed vertically up. The air bearing controlled by detector 104 causes the left side of platen 64 to be pushed vertically up while both sides of the platen are acted on by two air bearings 92 and 94 providing horizontal movement (along the X-axis.) Sensor 121 is physically located adjacent the top of platen 64 and a spot of light is projected thereon through a separate aperture on master 14 during exposure by illuminator 12.

It should be noted that the integrated exposure control 121 is set to allow the panel 18 to be consistently exposed notwithstanding the normal degradations associated with lamps as they age. The shutter is automatically closed when the detector reaches a predetermined illumination dosage. The operator then opens the load door 222, steps on the footswitch 220 to remove the vacuum applied to the platen 64, the exposed panel 18 is removed and another panel put into place, thereby completing the exposure cycle.

While the invention has been described with reference to its preferred embodiment, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

What is claimed is:

1. Apparatus for producing printed circuit boards including a projection imaging system for projecting an electrical circuit image from a master onto a radiation sensitive coated printed circuit board panel positioned at a location spaced apart from said master, said projection imaging system comprising:

means for generating radiation;

first support means for supporting said master, said master having said circuit pattern formed thereon in a predetermined size format, said radiation being incident on said pattern;

a projection lens assembly positioned with respect to said master for receiving radiation transmitted through said master and for projecting an image having a size format larger than said predetermined size format onto said radiation sensitive coated printed circuit board panel;

second support means for supporting said radiation sensitive coated printed circuit board panel at said spaced apart location;

registration means for maintaining said second support means in optical alignment with the image projected from said master, said registration means comprising at least two air bearings for positioning said second support means in first and second axial directions, said two air bearings comprising first and second air bearings positioned at opposite edges of said second support means and operating in a push-pull arrangement to position said second support means in said first and second axial directions, a third air bearing along the lateral edge of said second support means operating to position said second support means in third and fourth axial directions transverse to said first and second axial directions, a fourth air bearing along the same lateral edge of said second support means and adjacent to said third air bearing and operating in synchronization with said third air bearing to position said second support means in said third and fourth axial directions, or independently of said third bearing to provide a rotational adjusting movement to said second support means;

said second support means including an illumination source on one side of said printed circuit board panel and a radiation detector on the other side of said printed circuit board panel, said printed circuit board panel having holes associated therewith, the panel being in optical alignment with the image projected from said master when the radiation generated by said illumination source passes through said holes and is detected by said radiation detector; and means for maintaining the spacing between the radiation generating means and the master and the master and the radiation sensitive coated printed circuit board panel substantially constant.

2. The system as defined in claim 1 wherein multiple printed circuit boards are produced after said image is projected onto said radiation sensitive printed circuit board panel.

3. The system as defined in claim 1 further including vacuum means for holding the printed circuit board panel to said second support means.

4. The system as defined in claim 1 wherein the spacing maintaining means comprises a plurality of adjustable spacer rods to allow for perpendicularity adjustments when necessary.

5. The system as defined in claim 1 wherein said radiation generating means comprises:

integrator means for redistributing the light from a lamp into a beam of uniform intensity, and condensor/filter means to collimate the integrated light from said integrator means.

* * * * *